(12) United States Patent
Hayashi et al.

(10) Patent No.: US 7,829,374 B2
(45) Date of Patent: Nov. 9, 2010

(54) SILICON CARBIDE SEMICONDUCTOR DEVICE AND METHOD FOR MANUFACTURING THE SAME

(75) Inventors: Masashi Hayashi, Osaka (JP); Kazuya Utsunomiya, Hyogo (JP); Osamu Kusumoto, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/516,858

(22) PCT Filed: Jul. 18, 2008

(86) PCT No.: PCT/JP2008/001933

§ 371 (c)(1),
(2), (4) Date: May 29, 2009

(87) PCT Pub. No.: WO2009/013886

PCT Pub. Date: Jan. 29, 2009

(65) Prior Publication Data

US 2010/0055858 A1 Mar. 4, 2010

(30) Foreign Application Priority Data

Jul. 20, 2007 (JP) ............................ 2007-189209

(51) Int. Cl.
*H01L 21/28* (2006.01)
*H01L 29/12* (2006.01)
*H01L 29/78* (2006.01)

(52) U.S. Cl. .................. 438/99; 438/105; 438/268; 438/285; 438/602; 438/931; 257/E21.062; 257/77

(58) Field of Classification Search ................ 438/99, 438/105, 268, 285, 602, 931; 257/E21.054, 257/E21.062, 77

See application file for complete search history.

(56) References Cited

U.S. PATENT DOCUMENTS 5,124,779 A 6/1992 Furukawa et al.

(Continued)

FOREIGN PATENT DOCUMENTS

JP 5304314 11/1993

(Continued)

OTHER PUBLICATIONS

International Search Report for corresponding application No. PCT/JP2008/001933 completed Aug. 15, 2008.

(Continued)

*Primary Examiner*—Mary Wilczewski
(74) *Attorney, Agent, or Firm*—Renner, Otto, Boisselle & Sklar, LLP

(57) ABSTRACT

A semiconductor device according to the present invention includes a silicon carbide semiconductor substrate having a silicon carbide semiconductor layer; a p-type impurity region provided in the silicon carbide semiconductor layer and including a p-type impurity; a p-type ohmic electrode electrically connected to the p-type impurity region; an n-type impurity region provided in the silicon carbide semiconductor layer adjacent to the p-type impurity region, and including an n-type impurity; and an n-type ohmic electrode electrically connected to the n-type impurity region. The p-type ohmic electrode contains an alloy of nickel, aluminum, silicon and carbon, and the n-type ohmic electrode contains an alloy of titanium, silicon and carbon.

10 Claims, 9 Drawing Sheets

U.S. PATENT DOCUMENTS

| | | | |
|---|---|---|---|
| 5,686,755 A * | 11/1997 | Malhi | 257/492 |
| 5,980,265 A * | 11/1999 | Tischler | 438/93 |
| 6,423,986 B1 * | 7/2002 | Zhao | 257/138 |
| 6,544,674 B2 * | 4/2003 | Tuller et al. | 428/698 |
| 6,573,534 B1 | 6/2003 | Kumar et al. | |
| 6,599,644 B1 * | 7/2003 | Zekentes et al. | 428/627 |
| 6,667,495 B2 * | 12/2003 | Friedrichs et al. | 257/77 |
| 6,815,351 B2 * | 11/2004 | Friedrichs et al. | 438/688 |
| 6,841,812 B2 * | 1/2005 | Zhao | 257/256 |
| 7,473,929 B2 * | 1/2009 | Kusumoto et al. | 257/77 |
| 2004/0099888 A1 | 5/2004 | Sriram | |
| 2004/0183080 A1 * | 9/2004 | Kusumoto et al. | 257/77 |
| 2006/0057796 A1 | 3/2006 | Harada et al. | |
| 2006/0097267 A1 | 5/2006 | Kumar et al. | |

FOREIGN PATENT DOCUMENTS

| | | |
|---|---|---|
| JP | 2509713 | 4/1996 |
| JP | 10-308510 | 11/1998 |
| JP | 2940699 | 6/1999 |
| JP | 3079851 | 6/2000 |
| JP | 2002-93742 | 3/2002 |
| JP | 2003-318388 | 11/2003 |
| JP | 2003-347235 | 12/2003 |
| JP | 2006-135150 | 5/2006 |
| JP | 2006-324585 | 11/2006 |

OTHER PUBLICATIONS

Wenzel et al., "Diffusion barriers on titanium-based ohmic contact structures on SIC", High-Temperature Electronic Materials, Devices and Sensors Conference, Feb. 1998, IEEE, pp. 159-164.

Form PCT/ISA/237 and a partial English translation.

* cited by examiner (a)

(b) (ENLARGED VIEW OF THE CONTACT)

(c)

(a)

(b)

SILICON CARBIDE SEMICONDUCTOR DEVICE AND METHOD FOR MANUFACTURING THE SAME

TECHNICAL FIELD

The present invention relates to a silicon carbide semiconductor device, and in particular to a silicon carbide semiconductor device having n-type and p-type ohmic electrodes and a method for producing the same.

BACKGROUND ART

Conventionally, power devices using silicon (Si) semiconductors have been used as devices for power electronics. Devices for power electronics are required to operate at a higher frequency with a larger current. Various studies for research and development have been made to improve the performance of silicon power devices.

However, the performance of the silicon power devices is now approaching the theoretical limit thereof. In addition, power devices are occasionally required to operate in severe environments, for example, at a high temperature or under radiation. Silicon semiconductors are not suitable to use in such severe environments. For these reasons, studies are being made regarding devices using semiconductor materials other than silicon.

Among various semiconductor materials, a silicon carbide (SiC) semiconductor has a large forbidden band width (3.26 eV in the case of type 4H) and is superb in electric conduction control and radiation resistance at high temperature. The silicon carbide semiconductor has a breakdown field which is about one digit higher than that of silicon and so has a high withstand voltage, and also has a saturation drift speed of electrons which is about twice as high as that of silicon and so is controllable at a high frequency with a large power. Owing to these physical properties thereof as a semiconductor material, silicon carbide is anticipated as a semiconductor material for power devices operable at a higher frequency with a larger current.

When developing a semiconductor device using a new semiconductor material, it is necessary to develop a technology for forming a reliable ohmic contact having a low resistance to the semiconductor material. Conventionally, nickel (Ni) has been used as an ohmic electrode material for an n-type silicon carbide semiconductor material, and an eutectic or a stack of silicon (Si) and aluminum (Al), or titanium (Ti), has been used as an ohmic electrode material for a p-type silicon carbide semiconductor material.

However, the characteristics of the ohmic contact to especially the p-type silicon carbide semiconductor material have not been satisfactory. Specifically, when the material for a p-type ohmic electrode is thermally treated at a high temperature of about 1000° C. during the formation of the ohmic electrode, the material for the ohmic electrode is aggregated, which decreases the uniformity or generates a stress due to the aggregation. As a result, crystal distortion or transition occurs in the silicon carbide semiconductor, which causes a problem that the crystallinity is decreased.

When ohmic electrodes in general, not only ohmic electrodes to the p-type silicon carbide semiconductor, are formed, a natural oxide layer is generated at a surface of the silicon carbide semiconductor before a metal layer is deposited. This natural oxide layer has a problem of exerting an adverse effect on the ohmic characteristics when the ohmic electrode and the silicon carbide semiconductor are alloyed with each other.

In light of these problems with the formation of an ohmic electrode to the p-type silicon carbide semiconductor, Patent Documents 1 and 2, for example, disclose using a stacking structure of metal layers of nickel, titanium and aluminum or an alloy of titanium and aluminum.

Patent Document 1: Japanese Patent No. 2509713
Patent Document 2: Japanese Patent No. 2940699

DISCLOSURE OF THE INVENTION

Problems to be Solved by the Invention

FIG. 12(a) schematically shows a part of a structure of a vertical FET using a conventional silicon carbide semiconductor and having an ohmic electrode. FIG. 12(b) has an enlarged view of an ohmic contact thereof. As shown in FIGS. 12(a) and (b), a p-well region 104 is formed in an n-type silicon carbide semiconductor layer 102, and an n-type impurity region 105 and a p-type impurity region 107 are provided in the p-well region 104. The n-type impurity region 105 and the p-type impurity region 107 are in contact with an ohmic electrode 116, which is connected to a pad electrode 117.

A channel layer 108 is provides so as to cover a part of each of the n-type silicon carbide semiconductor layer 102, the p-well region 104 and the n-type impurity region 105. On the channel layer 108, a gate electrode 110 is provided with a gate insulating layer 109 provided therebetween. Between the gate electrode 110 and the pad electrode 117, an insulating layer 114 is provided. An ohmic electrode 101 is provided on a surface of the n-type silicon carbide semiconductor layer 102 on which the p-well region 104 is not provided.

As shown in FIG. 12(b), in the conventional vertical FET, the n-type impurity region 105 and the p-type impurity region 107 are in contact with each other, and the ohmic electrode 116 acting as an ohmic contact to these regions is provided. The n-type impurity region 105 acts as a source region for connecting the channel layer 108 and the ohmic electrode 116 with a low resistance. The p-type impurity region 107 connects the p-well region 104 and the ohmic electrode 116 with a low resistance and fixes the p-well region 104 to a reference potential. In such a contact structure, it has been common to form one ohmic electrode 116 having the same structure of the same metal material in order to avoid the production process from becoming complicated. However, the ohmic electrode 116 needs to act as an n-type ohmic electrode for the n-type impurity region 105 and as a p-type ohmic electrode for the p-type impurity region 107.

For example, where a titanium reaction layer is used for the ohmic electrode 116, even if the impurity concentration is relatively low ($5 \times 10^{19}$ cm$^{-3}$ or lower), an ohmic contact can be easily provided to the n-type impurity region. However, to the p-type impurity region, if the impurity concentration is low, it is very difficult to provide an ohmic contact.

FIG. 13 shows the dependency on the p-type impurity concentration when a titanium reaction layer is formed as follows. A titanium layer is vapor-deposited to 100 nm on a p-type impurity region and thermally treated at 950° C. for 1 minute to react silicon and carbon in the p-type impurity region with the titanium layer. As shown in FIG. 13, where the impurity concentration of the p-type impurity region is high and close to $1 \times 10^{21}$ cm$^{-3}$, a substantially sufficient ohmic characteristic is provided. By contrast, where the impurity concentration is as low as $1 \times 10^{20}$ cm$^{-3}$ or lower, it is difficult to provide a sufficient ohmic characteristic. As is clear from FIG. 13, a p-type impurity region of a high concentration needs to be formed in order to provide a good ohmic characteristic. This requires p-type impurity ions of a high dose to be implanted into the p-type impurity region. However, such a high impurity concentration can only be achieved by performing ion implantation for a long time, which decreases the productivity of the semiconductor device and increases the production cost.

In the case where aluminum or a stacking structure containing aluminum is used for forming an ohmic electrode to a p-type silicon carbide semiconductor, the following occurs. If aluminum is left on an interlayer insulating layer, the aluminum is diffused throughout the interlayer insulating layer by the thermal treatment performed at a high temperature for forming an ohmic electrode and reaches the gate insulating layer. This causes a problem of decreasing the breakdown withstand voltage, reliability or the like.

The present invention for solving these problems of the conventional art has an object of realizing a silicon carbide semiconductor device having superb characteristics.

Means for Solving the Problems

A semiconductor device according to the present invention comprises a silicon carbide semiconductor substrate having a silicon carbide semiconductor layer; a p-type impurity region provided in the silicon carbide semiconductor layer and including a p-type impurity; a p-type ohmic electrode electrically connected to the p-type impurity region; an n-type impurity region provided in the silicon carbide semiconductor layer and adjacent to the p-type impurity region, and including an n-type impurity; and an n-type ohmic electrode electrically connected to the n-type impurity region. The p-type ohmic electrode contains an alloy of nickel, aluminum, silicon and carbon, and the n-type ohmic electrode contains an alloy of titanium, silicon and carbon.

In one preferable embodiment, the p-type ohmic electrode has a p-type reaction layer containing an alloy of nickel, aluminum, silicon and carbon.

In one preferable embodiment, the p-type reaction layer further contains titanium.

In one preferable embodiment, the n-type ohmic electrode has an n-type reaction layer containing an alloy of titanium, silicon and carbon.

In one preferable embodiment, the n-type ohmic electrode and the p-type ohmic electrode each further includes a titanium nitride layer.

In one preferable embodiment, in the n-type ohmic electrode, the titanium nitride layer has a thickness greater than that of the n-type reaction layer.

In one preferable embodiment, the reaction layer of the p-type ohmic electrode is in contact with the p-type impurity region.

In one preferable embodiment, the reaction layer of the n-type ohmic electrode is in contact with the n-type impurity region.

In one preferable embodiment, on a surface of the silicon carbide semiconductor layer, the n-type ohmic electrode is provided so as to surround the p-type ohmic electrode.

In one preferable embodiment, the p-type ohmic electrode has a higher concentration of the carbon on the side of the p-type impurity region than on a surface of the p-type ohmic electrode.

In one preferable embodiment, the n-type ohmic electrode has a higher concentration of the carbon on the side of the n-type impurity region than on a surface of the n-type ohmic electrode.

In one preferable embodiment, the semiconductor device further comprises a channel layer provided on a part of the surface of the silicon carbide semiconductor layer so as to be in contact with the n-type impurity region; a gate insulating layer provided on the channel layer; and a gate electrode provided on the gate insulating layer.

In one preferable embodiment, the semiconductor device further comprises a well region doped with a p-type impurity and provided in the silicon carbide semiconductor layer so as to surround the n-type impurity region; a gate insulating layer provided on the well region; and a gate electrode provided on the gate insulating layer.

In one preferable embodiment, the semiconductor device further comprises another ohmic electrode provided on a surface of the semiconductor substrate opposite to the silicon carbide semiconductor layer.

A method for producing a semiconductor device according to the present invention comprises a step (a) of preparing a silicon carbide semiconductor layer including an n-type impurity region and a p-type impurity region provided so as to be adjacent to each other; a step (b) of forming a stacking layer including a nickel layer and an aluminum layer on the p-type impurity region; a step (c) of thermally treating the stacking layer to form a p-type ohmic electrode containing an alloy of nickel, aluminum, silicon and carbon on the p-type impurity region; a step (d) of forming a titanium layer on at least a part of the n-type impurity region; and a step (e) of thermally treating the titanium layer to form an n-type ohmic electrode containing an alloy of titanium, silicon and carbon on the n-type impurity region.

In one preferable embodiment, the thermal treatment in steps (c) and (e) is performed at a temperature of 850° C. or higher and 1050° C. or lower.

In one preferable embodiment, the thermal treatment in steps (c) and (e) is performed in an atmosphere containing nitrogen gas or argon gas.

In one preferable embodiment, the step (b) includes a step (b1) of forming a mask for exposing the p-type impurity region on the silicon carbide semiconductor layer; and a step (b2) of forming the stacking layer on the p-type impurity region and the mask. The method comprises a step (f) of removing the stacking layer on the mask between the step (b2) and the step (d).

In one preferable embodiment, the step (d) includes a step (d1) of forming an insulating layer having a contact hole for exposing a part of the n-type impurity region and the p-type ohmic electrode on the silicon carbide semiconductor layer; and a step (d2) of forming the titanium layer on the part of the n-type impurity region in the contact hole, on the p-type ohmic electrode and on the insulating layer. The method comprises a step (g) of removing at least a part of the titanium layer on the insulating layer after the step (d2).

In one preferable embodiment, in the step (f), the stacking layer is removed by wet etching.

In one preferable embodiment, in the step (f), the stacking layer is removed by dry etching.

In one preferable embodiment, in the step (f), the mask is removed to remove the stacking layer on the mask.

In one preferable embodiment, in the step (g), the titanium layer is removed by wet etching.

In one preferable embodiment, in the step (g), the titanium layer is removed by dry etching.

In one preferable embodiment, in the step (g), the mask forms the p-type impurity region in the silicon carbide semiconductor layer by implantation of impurity ions.

In one preferable embodiment, the step (e) includes a step (e1) of thermally treating the titanium layer to react silicon and carbon in the n-type impurity region with a part of the titanium layer to form an alloy of titanium, silicon and carbon; and a step (e2) of removing an unreacted part of the titanium layer to form an n-type ohmic electrode containing the alloy on the n-type impurity region.

In one preferable embodiment, in the step (e2), the part of the titanium layer not reacted with silicon or carbon is removed by wet etching.

EFFECTS OF THE INVENTION

According to the present invention, in a semiconductor device including an n-type impurity region and a p-type impurity region provided adjacent to each other in a silicon carbide semiconductor layer, an n-type ohmic electrode containing titanium, silicon and carbon and a p-type ohmic electrode containing nickel, aluminum, silicon and carbon are respectively provided in the n-type impurity region and the p-type impurity region. The n-type ohmic electrode and the p-type ohmic electrode can realize a low resistance ohmic contact respectively to an n-type silicon carbide semiconductor and a p-type silicon carbide semiconductor. Therefore, a low resistance ohmic contact can be realized without making high the impurity concentration of the n-type impurity region or the p-type impurity region. Accordingly, in a switching device such as a MISFET, a MOSFET or the like, a low resistance p-type ohmic electrode can be formed without increasing the n-type contact resistance which significantly influences the ON resistance, and thus the switching characteristic can be improved.

Figure 1:
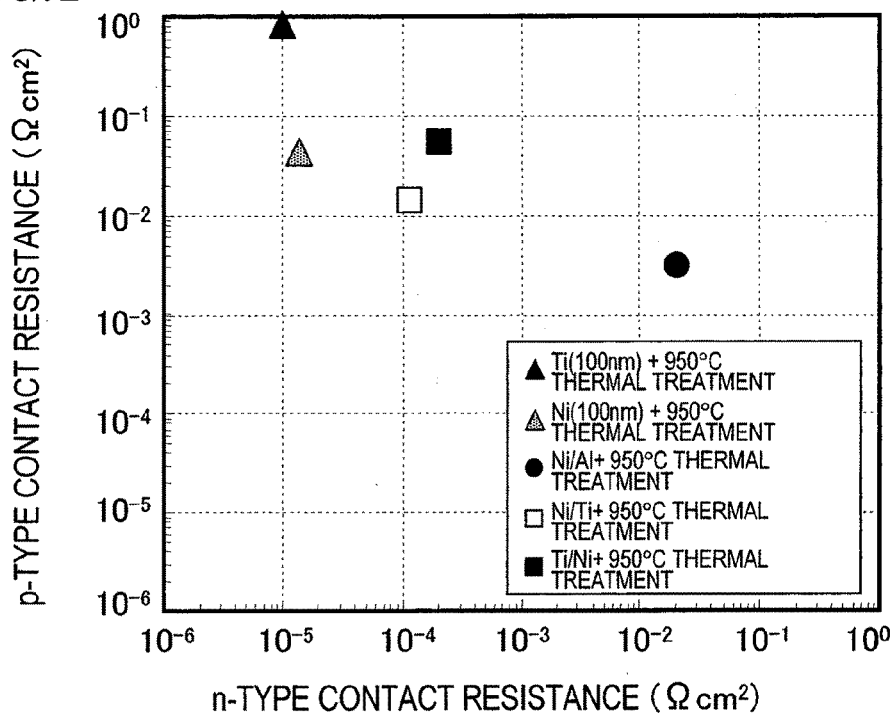
FIG. 1 shows contact resistances of ohmic electrodes formed on p-type silicon carbide semiconductor and n-type silicon carbide semiconductor using various ohmic electrode materials.

DESCRIPTION OF THE REFERENCE NUMERALS 1, 101 Silicon carbide semiconductor substrate
2, 102 High resistance silicon carbide semiconductor layer
3, 103 n-type impurity implantation mask
4, 104 p-well region
5, 105 n-type impurity region
6 p-type impurity implantation mask
7, 107 p-type impurity region
8, 108 Channel layer
9, 109 Gate insulating layer
10, 110 Gate electrode
11, 111 First interlayer insulating layer
12 Nickel/aluminum stacking electrode layer
13, 113 p-type ohmic electrode
14, 114 Second interlayer insulating layer
15 Titanium layer
16, 116 n-type ohmic electrode
17, 117 Pad electrode
18, 118 Drain electrode

BEST MODE FOR CARRYING OUT THE INVENTION

The present inventors formed ohmic electrodes on p-type silicon carbide semiconductor substrates and n-type silicon carbide semiconductor substrates using various types of ohmic electrode materials and measured the contact resistance. FIG. 1 is a graph showing the measurement results of the contact resistance of an ohmic electrode formed on each of a p-type silicon carbide semiconductor substrate and an n-type silicon carbide semiconductor substrate using each of titanium, nickel, nickel/aluminum, nickel/titanium and titanium/nickel. The impurity concentration of each of the p-type silicon carbide semiconductor substrate and the n-type silicon carbide semiconductor substrate is $5\times10^{19}$ $cm^{-3}$, and the thermal treatment temperature is 950° C.

As shown in FIG. 1, a metal material having a low ohmic contact resistance to the n-type silicon carbide semiconductor, such as titanium, nickel or the like, shows a high ohmic contact resistance to the p-type silicon carbide semiconductor. By contrast, nickel/aluminum realizes a low resistance ohmic contact to the p-type silicon carbide semiconductor, but has a high ohmic contact resistance to the n-type silicon carbide semiconductor.

Figure 2:
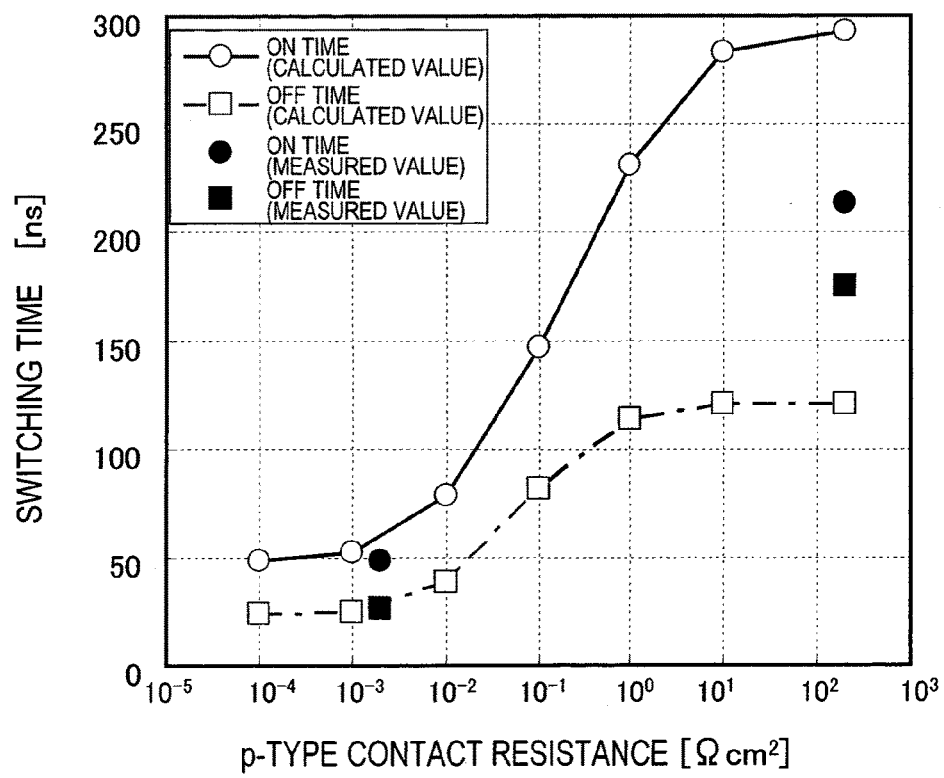
FIG. 2 is a graph showing the relationship between the p-type contact resistance and the switching time in a vertical FET shown in FIG. 12.
Figure 12:
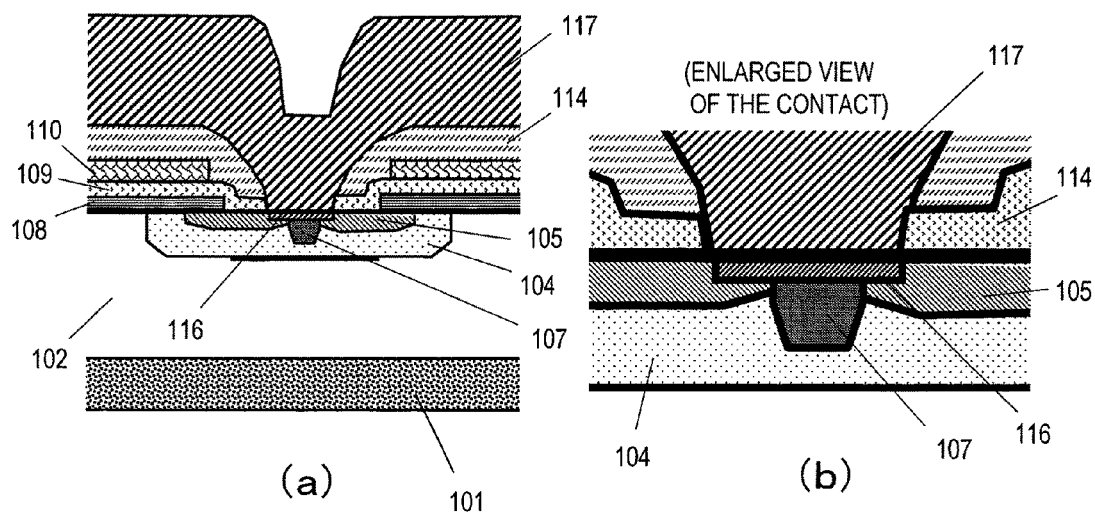
FIG. 12(a) is a cross-sectional view showing a structure of a conventional semiconductor device.
FIG. 12(b) shows an ohmic electrode and the vicinity thereof in enlargement.
Figure 13:
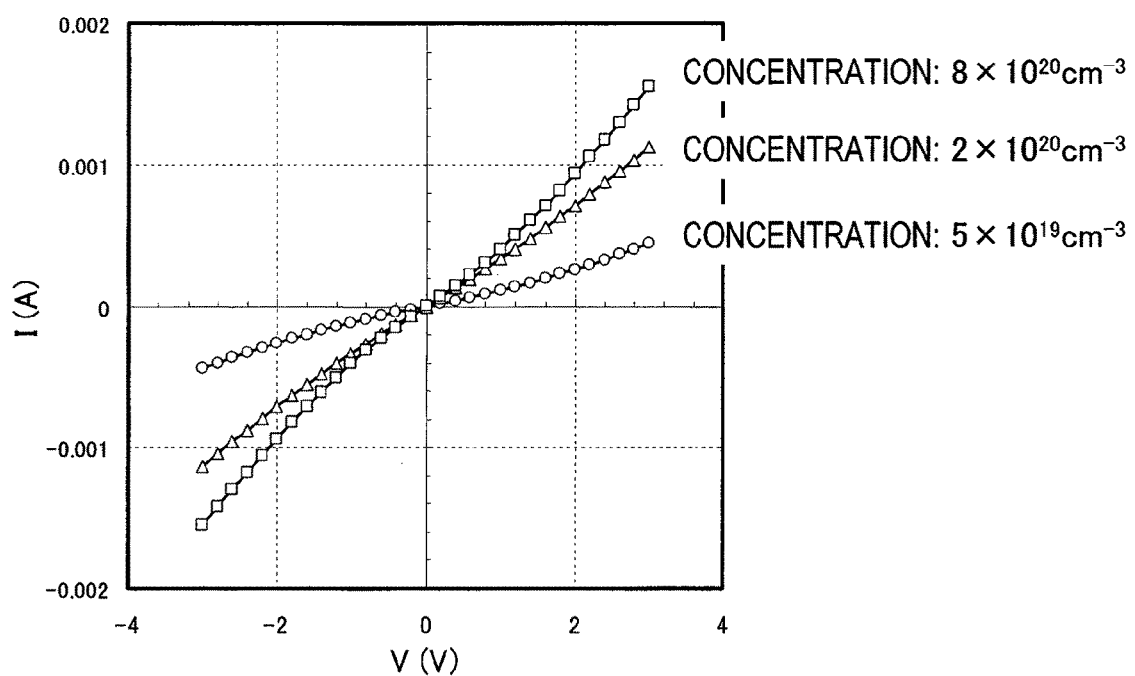
FIG. 13 shows the impurity concentration dependency of the current vs. voltage characteristic of a silicon carbide/titanium layer interface formed by depositing a titanium layer to 100 nm on a conventional p-type silicon carbide semiconductor substrate and then thermally treating the resultant assembly.

FIG. 2 shows the relationship between the p-type contact resistance and the switching time in a vertical FET shown in FIG. 12. As shown in FIG. 2, as the p-type contact resistance is higher, the switching time is longer. This occurs for the following reason. In the case where the contact resistance between the p-well region 104 in contact with the channel layer 108 and the ohmic electrode 116 is high, the p-well region 104 is not completely fixed to the reference potential and floating charges are accumulated; and as a result, the switching is delayed. In this case, it is difficult to operate the vertical FET at a high speed.

Based on such knowledge, the present inventors conceived a silicon carbide semiconductor device having a novel structure. The present invention realizes low resistance p-type and n-type ohmic contacts in a silicon carbide semiconductor device by providing ohmic electrodes having different compositions on an n-type impurity region and a p-type impurity region both having a relatively low impurity concentration ($5\times10^{19}$ cm$^{-3}$ or lower). Therefore, the present invention is preferably usable for insulating gate-type transistors such as MISFETs, MOSFETs and the like using a silicon carbide semiconductor. Hereinafter, examples in which the present invention is applied to a vertical double implantation MISFET will be described.

Embodiment 1

Figure 3:
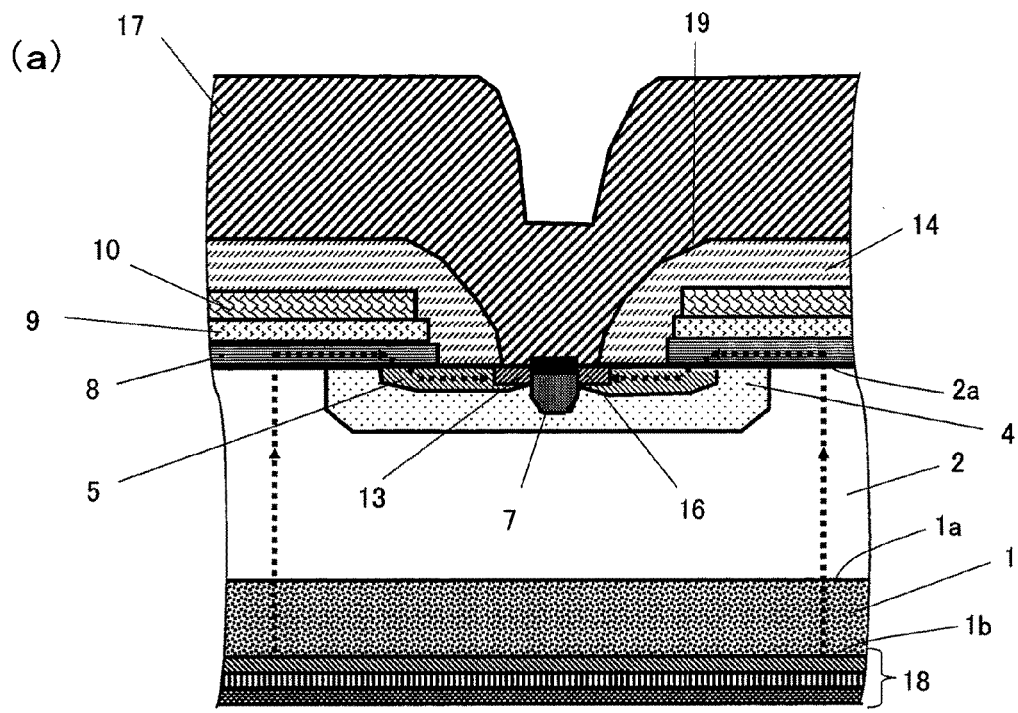
FIG. 3(a) is a cross-sectional view showing a structure of a semiconductor device in Embodiment 1 according to the present invention.
FIG. 3(b) shows an ohmic electrode and the vicinity thereof in enlargement.
FIG. 3(c) is a plan view showing the locations of n-type and p-type impurity regions.
Figure 3:
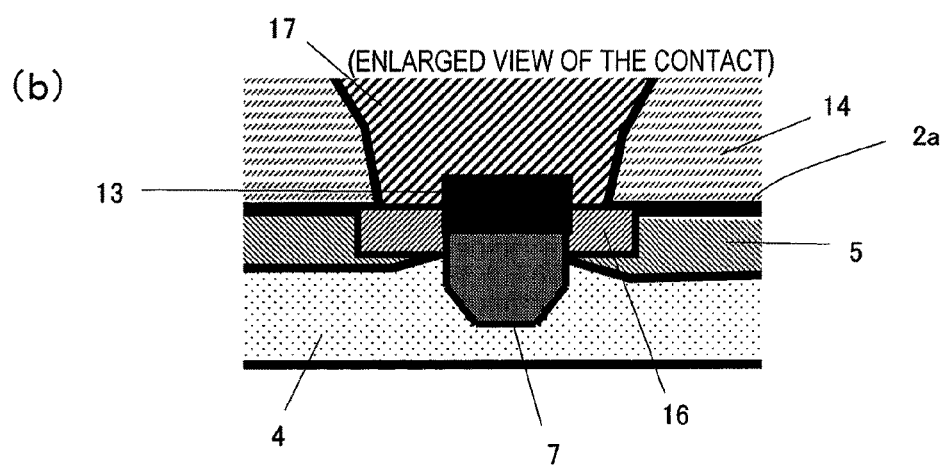
Figure 3:
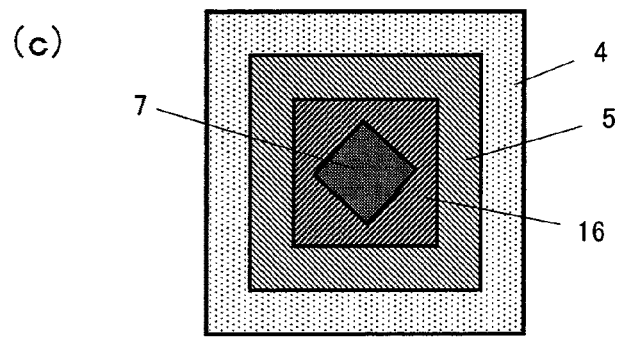

FIG. 3(a) is a schematic cross-sectional view showing a semiconductor device in Embodiment 1 According to the present invention. The semiconductor device shown in FIG. 3(a) includes a silicon carbide semiconductor layer 2.

The silicon carbide semiconductor layer 2 is formed of a silicon carbide semiconductor. The silicon carbide semiconductor layer 2 may be a bulk forming a semiconductor substrate or an epitaxial layer formed on a semiconductor substrate. In this embodiment, the silicon carbide semiconductor layer 2 is formed on a silicon carbide semiconductor substrate 1 by epitaxial growth. The silicon carbide semiconductor substrate 1 is an off substrate having an off angle of, for example, 8 degrees from the (0001) surface of 4H—SiC. The silicon carbide semiconductor substrate 1 is doped with an n-type impurity such as nitrogen, phosphorus, arsenic or the like at a concentration of, for example, $1\times10^{18}$ cm$^{-3}$ or higher, and has a low resistance. The silicon carbide semiconductor layer 2 is provided on a first main surface 1a of the silicon carbide semiconductor substrate 1 by epitaxial growth. Preferably, the silicon carbide semiconductor layer 2 is doped with an n-type impurity such as nitrogen or the like at about $1\times10^{15}$ cm$^{-3}$ to $1\times10^{16}$ cm$^{-3}$, and has a high resistance.

In the silicon carbide semiconductor layer 2, a p-well region 4 is formed inward from a surface 2a of the silicon carbide semiconductor layer 2. In the p-well region 4, an n-type impurity region 5 is formed inward from the surface 2a of the silicon carbide semiconductor layer 2. The n-type impurity region 5 acts as a source region.

A p-type impurity region 7 is formed inward from the surface 2a of the silicon carbide semiconductor layer 2, so as to be adjacent to the n-type impurity region 5. The p-well region 4 has an impurity concentration of, for example, $1\times10^{16}$ cm$^{-3}$ to $1\times10^{18}$ cm$^{-3}$. Preferably, the n-type impurity region 5 and the p-type impurity region 7 are doped with impurities at such a high concentration that provides a good ohmic characteristic but does not decrease the productivity or increase the production cost. Specifically, the impurity concentration of the n-type impurity region 5 is preferably in the range of $1\times10^{19}$ cm$^{-3}$ to $8\times10^{20}$ cm$^{-3}$, and the impurity concentration of the p-type impurity region 7 is preferably in the range of $1\times10^{19}$ cm$^{-3}$ to $2\times10^{20}$ cm$^{-3}$.

An n-type ohmic electrode 16 and a p-type ohmic electrode 13 are respectively provided so as to be in contact with the n-type impurity region 5 and the p-type impurity region 7. As described later in detail, the n-type ohmic electrode 16 contains titanium, silicon and carbon, and the p-type ohmic electrode 13 contains nickel, aluminum, silicon and carbon.

A channel layer 8 is provided so as to cover a part of the surface 2a of the silicon carbide semiconductor layer 2 on which the p-well region 4 is not provided, a part of the p-well region 4 which is exposed on the surface 2a of the silicon carbide semiconductor layer 2 and a part of the n-type impurity region 5 which is exposed on the surface 2a of the silicon carbide semiconductor layer 2. The channel layer 8 includes, for example, a stacking structure including a plurality of silicon carbide semiconductor layers formed by epitaxial growth. Specifically, the stacking structure of the channel layer 8 includes a plurality of n-type impurity high concentration doped layers (δ doped layers) and low concentration doped layers exhibiting a steep concentration gradient which are stacked alternately.

On the channel layer 8, a gate insulating layer 9 is provided. On the gate insulating layer 9, a gate electrode 10 is provided. The gate insulating layer 9 is formed of silicon oxide or the like. The gate electrode 10 is formed by, for example, reduced pressure CVD of polysilicon doped with an n-type impurity such as phosphorus or the like. A second interlayer insulating layer 14 covers the surface of the silicon carbide semiconductor layer 2 except for the p-type ohmic electrode 13 and the n-type ohmic electrode 16. On the second interlayer insulating layer 14, a pad electrode 17 is provided. The pad electrode 17 is formed of one of aluminum, silicon, titanium and copper or an alloy of a plurality thereof, and is electrically connected to the ohmic electrodes 13 and 16 via a contact hole 19 provided in the second interlayer insulating layer 14.

On a surface 1b of the silicon carbide semiconductor substrate 1 on which the silicon carbide semiconductor layer 2 is not provided, another ohmic electrode 18 corresponding to a drain electrode is provided. The ohmic electrode 18 is electrically connected to a surface of the silicon carbide semiconductor layer 2 on which the p-well region 2 is not provided. The ohmic electrode 18 includes a metal layer formed of one of Ti, Ni, Cr, Au, Ag, Pt or the like, or includes a stacking structure of a plurality of metal layers selected therefrom. These metal layers are formed by vacuum vapor deposition or the like.

The semiconductor device shown in FIG. 3(a) can control a current, passing in a channel region formed in the channel layer 8, especially, a part of the channel layer 8 interposed between the gate electrode 10 and the p-well region 4, by changing the voltage applied on the gate electrode 10. Thus, as shown by the doted lines in FIG. 3(a), the current flowing from the ohmic electrode 18 to the pad electrode 17 connected to the reference potential via the silicon carbide semiconductor substrate 1, the silicon carbide semiconductor layer 2, the channel layer 8, the n-type impurity region 5 and the n-type ohmic electrode 16 can be adjusted.

As described above, the p-type ohmic electrode 13 electrically connected to the pad electrode 17 is fixed to the reference potential. Thus, the p-type impurity region 7 and the p-well region 4 are also fixed to the reference potential. Therefore, the potential of the part of the channel layer 8 interposed between the gate electrode 10 and the p-well region 4, more specifically, the potential of this part on the side of the p-well region 4 can be fixed to the reference potential. As a result, the potential of the channel layer 8 can be suppressed from being changed. Even when the gate voltage is changed at a high speed to switch the semiconductor device, the potential of the channel region can be suppressed from being changed and thus the switching can be suppressed from being delayed. Especially because the p-type impurity region 7 is provided adjacent to the n-type impurity region 5 electrically connected to the channel layer 8, the p-well region 4 can be fixed to the reference potential at a position in the vicinity of the channel region formed in the channel layer 8. Accordingly, the vertical MISFET having a structure in which the p-type impurity region 7 is provided adjacent to the n-type impurity region 5 can control the current with certainty even when being switched at a high speed, and is preferably usable as a switching power device which is operable at a high speed with a large current through exploitation of the characteristics of the silicon carbide semiconductor.

Now, the n-type ohmic electrode 16 and the p-type ohmic electrode 13 of the semiconductor device according to the present invention will be described in detail. FIG. 3(b) is a cross-sectional view showing, in enlargement, a structure of the n-type ohmic electrode 16, the p-type ohmic electrode 13 and the vicinity thereof. As shown in FIG. 3(b), the n-type ohmic electrode 16 and the p-type ohmic electrode 13 are respectively in ohmic contact with the n-type impurity region 5 and the p-type impurity region 7.

As described above, the n-type ohmic electrode 16 and the p-type ohmic electrode 13 are formed respectively on the n-type impurity region 5 and the p-type impurity region 7. FIG. 3(c) shows the locations of the n-type impurity region 5 and the p-type impurity region 7 on the surface 2a of the silicon carbide semiconductor layer 2. As shown in FIG. 3(c), the p-type impurity region 7 is surrounded by the n-type impurity region 5. The n-type impurity region 5 is surrounded by the p-well region 4.

The n-type ohmic electrode 16 is formed of an n-type reaction layer containing an alloy of titanium, silicon and carbon. The n-type ohmic electrode 16 does not contain nickel or aluminum contained in the p-type ohmic electrode 13. A titanium layer is formed on a surface of the n-type impurity region 5 and thermally treated, and as a result, silicon and carbon in the n-type impurity region 5 and titanium in the titanium layer are mutually diffused and alloyed with each other. Owing to this, the n-type reaction layer is formed inward from the surface 2a of the silicon carbide semiconductor layer 2 so as to be in contact with the n-type impurity region 5.

Titanium is likely to react with carbon and form a compound. Therefore, carbon and titanium are bonded together inside the n-type reaction layer, which suppresses carbon in the n-type impurity region 5 from being deposited on a surface of the n-type ohmic electrode 16. Owing to this, the adhesiveness between the n-type ohmic electrode 16 and the pad electrode 17 is prevented from being decreased, which would otherwise occur as a result of carbon being deposited on the surface of the n-type ohmic electrode 16.

The n-type ohmic electrode 16 preferably has a thickness of 10 nm or greater. Where the thickness of the n-type ohmic electrode 16 is smaller than 10 nm, it is difficult to realize the n-type ohmic electrode 16 with a low resistance.

The p-type ohmic electrode 13 is formed of a p-type reaction layer containing an alloy of nickel, aluminum, silicon and carbon. The p-type ohmic electrode 13 is formed as follows. A nickel layer and an aluminum layer are stacked on a surface of the p-type impurity region 7 and thermally treated. As a result, nickel and aluminum are alloyed with each other, and silicon and carbon are diffused from the p-type impurity region 7. Note that neither nickel nor aluminum is mutually diffused with silicon carbide as extensively as titanium. Therefore, the p-type reaction layer is formed slightly inward from the surface 2a of the silicon carbide semiconductor layer 2 and thus is in contact with the p-type impurity region 7.

In order to form the p-type ohmic electrode 13, the nickel layer and the aluminum layer are only need to be formed on the p-type impurity region 7. Therefore, the nickel layer and the aluminum layer can be patterned preferably using a mask for forming the p-type impurity region 7.

The p-type ohmic electrode 13 preferably has a thickness of 10 nm or greater. Where the thickness of the p-type ohmic electrode 13 is smaller than 10 nm, it is difficult to realize the p-type ohmic electrode 13 with a low resistance.

As described above with reference to FIG. 1, titanium is a good ohmic electrode material for an n-type silicon carbide semiconductor, but does not form a good ohmic contact with a p-type silicon carbide semiconductor. Therefore, for forming the p-type ohmic electrode 13, it is preferable that the p-type reaction layer does not contain titanium. By contrast, once the p-type reaction layer is formed, a titanium layer provided on the p-type reaction layer does not influence much the ohmic contact between the p-type reaction layer and the p-type impurity region 7.

Therefore, when the p-type ohmic electrode 13 is first formed, it is not necessary to pattern the titanium layer such that the titanium layer is formed only on the n-type impurity region 5 when the n-type ohmic electrode 16 is formed. The titanium layer may also be formed on the p-type reaction layer 13a of the p-type ohmic electrode 13 adjacent to the n-type ohmic electrode 16. Namely, even where the n-type impurity region 5 is adjacent to the p-type impurity region 7, it is not necessary, when the n-type ohmic electrode 13 is formed, to perform positional alignment to the p-type impurity region 7 or the p-type ohmic electrode 13. The n-type ohmic electrode 16 can be formed only on the n-type impurity region 5 of a different material from that of the p-type ohmic electrode 13. Especially in the case as shown in FIG. 3(c) where the p-type impurity region 7 is surrounded by the n-type impurity region 5, in order to form a titanium layer only on the n-type impurity region 5, the titanium layer on the p-type ohmic electrode 13 needs to be removed by performing positional alignment to the p-type ohmic electrode 13 on the p-type impurity region 7. According to this embodiment, such a trouble can be eliminated and thus the productivity is improved.

In this case, the thermal treatment performed for forming the n-type ohmic electrode 16 causes the titanium layer provided on the p-type ohmic electrode 13 to be slightly diffused inside the p-type ohmic electrode 13. As a result, the p-type reaction layer forming the p-type ohmic electrode 13 contains an alloy of nickel, aluminum, titanium, silicon and carbon. Titanium contained in the p-type reaction layer suppresses carbon in the p-type impurity region 7 from being deposited on a surface of the p-type ohmic electrode 13, like in the case of the n-type ohmic electrode 16. Owing to this, the adhesiveness between the p-type ohmic electrode 13 and the pad electrode 17 is prevented from being decreased, which would otherwise occur as a result of carbon being deposited on the surface of the p-type ohmic electrode 13.

As described later in detail, the titanium layer provided on the p-type ohmic electrode 13 is removed before forming the pad electrode 17. Therefore, the titanium layer provided on the p-type ohmic electrode 13 is not shown in FIG. 3(a) or (b).

As described above, according to the semiconductor device of the present invention, the p-type ohmic electrode 13 with a low contact resistance can be formed in contact only with the p-type impurity region 7 having a relatively low impurity concentration by using an implantation mask originally used for forming the p-type impurity region 7.

After the p-type ohmic electrode 13 is formed, a titanium layer for forming the n-type ohmic electrode 16 is formed so as to cover the n-type impurity region 5 and the p-type ohmic electrode 13 and thermally treated. Thus, the n-type ohmic electrode 16 can be formed only on the n-type impurity region 5. Accordingly, even with a contact structure in which the n-type impurity region 5 and the p-type impurity region 7 are adjacent to each other, n-type and p-type ohmic electrodes having different metal compositions can be formed. As a result, in the MISFET, a low resistance p-type ohmic electrode can be formed and thus the contact resistance can be decreased. This improves the switching (turn-off) characteristics. In addition, it is not necessary to implant the p-type impurity at a high concentration, which reduces the production cost and shortens the time necessary for production, for example.

Now, an example of method for producing a semiconductor device shown in FIG. 3(a) will be described. FIGS. 4(a) through (l) are cross-sectional views during the production of the semiconductor device.

Figure 4:
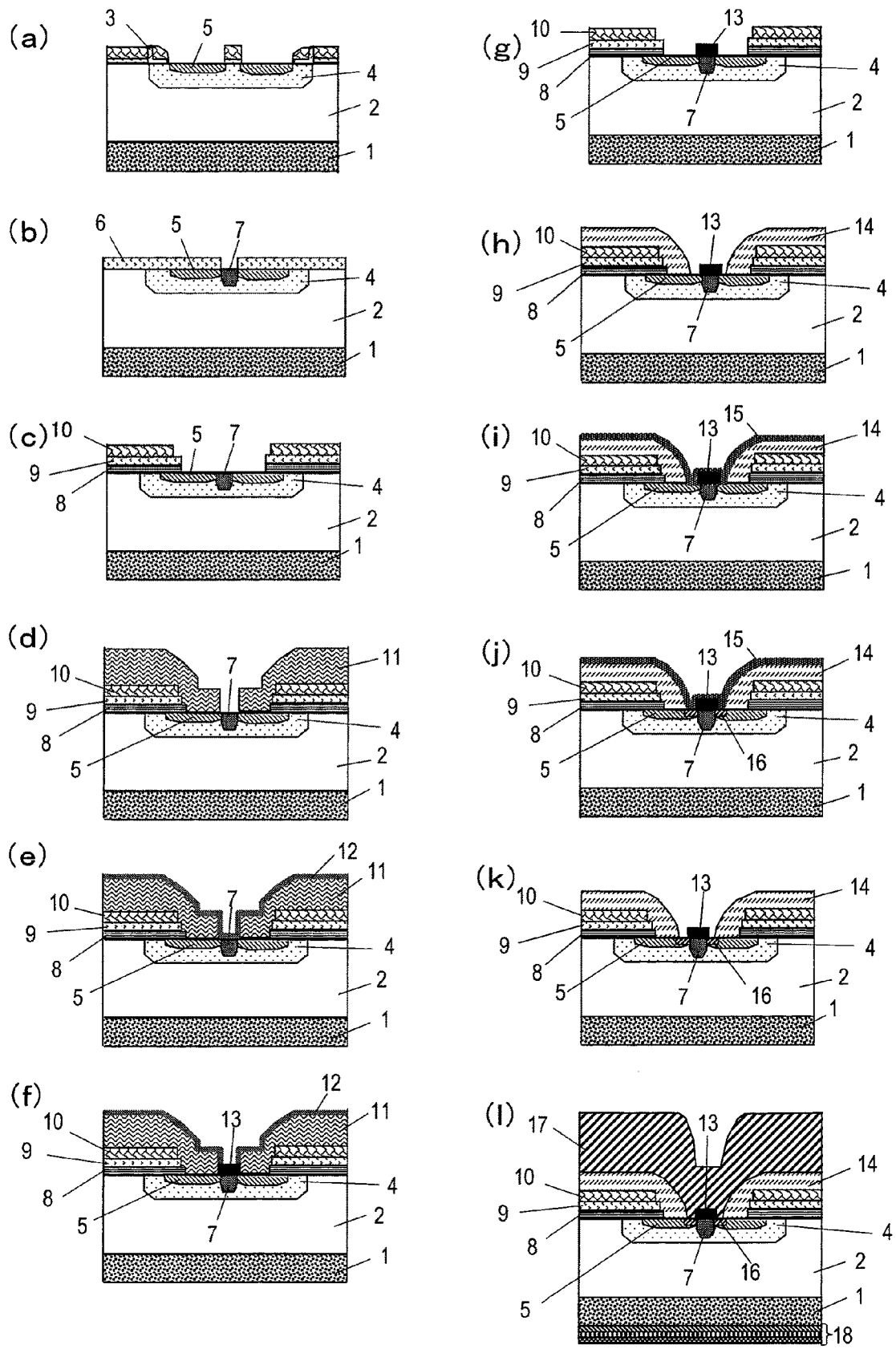
FIGS. 4(a) through (l) are cross-sectional views of steps showing a method for producing the semiconductor device shown in FIG. 3.

First, as shown in FIG. 4(a), the silicon carbide semiconductor substrate 1 having a main surface which has an off angle of 8 degrees from the (0001) surface of 4H—SiC is prepared. The silicon carbide semiconductor substrate 1 is doped with an n-type impurity at about $8 \times 10^{18}$ cm$^{-3}$. On the main surface of the silicon carbide semiconductor substrate 1, the silicon carbide semiconductor layer 2, which contains an n-type impurity at a lower concentration than the silicon carbide semiconductor substrate 1 and has a high resistance, is epitaxially grown by thermal CVD or the like. The silicon carbide semiconductor layer 2 uses, for example, silane (SiH$_4$) and propane (C$_3$H$_8$) as a material gas, hydrogen (H$_2$) as a carrier gas, and nitrogen (N$_2$) as a dopant gas. For example, for producing a MISFET having a withstand voltage of 1400 V, it is preferable that the impurity concentration of the high resistance silicon carbide semiconductor layer 2 is $1 \times 10^{15}$ cm$^{-3}$ to $1 \times 10^{16}$ cm$^{-3}$ and that the thickness thereof is 10 μm or greater.

Next, a part of the silicon carbide semiconductor layer 2 is doped with a p-type impurity (aluminum, boron or the like) by ion implantation to form the p-well region 4. The p-well region 4 is formed as follows. A silicon oxide layer (not shown) having a thickness of about 3 μm to act as an implantation mask is deposited on a top surface of the silicon carbide semiconductor layer 2, and an opening is formed, by photolithography and dry etching, only in a part of the silicon oxide layer in which the p-well region 4 is to be formed. Then, ion implantation of aluminum or boron is performed while the substrate temperature is kept as high as 500° C. or higher in order to reduce the implantation crystal defect. After the ion implantation, the silicon oxide layer used as the mask is removed by an aqueous solution of hydrofluoric acid. The concentration of the p-type impurity in the p-well region 4 is usually about $1 \times 10^{17}$ cm$^{-3}$ to $1 \times 10^{18}$ cm$^{-3}$. The p-well region 4 has a depth of about 1 μm so as not to be pinched off.

Next, a part of a surface part of the p-well region 4 is doped with an n-type impurity at a high concentration by ion implantation to form the n-type impurity region 5. The n-type impurity region 5 is formed as follows. A silicon oxide layer having a thickness of about 1 μm to act as an implantation mask 3 is deposited on the silicon carbide semiconductor layer 2, and an opening is formed, by photolithography and dry etching, only in a part of the silicon oxide layer in which the n-type impurity region 5 is to be formed. Ion implantation of nitrogen or phosphorus is performed while the substrate temperature is kept as high as 500° C. or higher in order to reduce the implantation defect. After the ion implantation, the silicon oxide layer used as the mask is removed by an aqueous solution of hydrofluoric acid. The n-type impurity region 5 acts as a source of the MISFET. In the case where the impurity concentration of the n-type impurity region 5 is about the same as that of the p-type impurity region 7 described later, the implantation mask for forming the n-type impurity region 5 needs to cover the p-type impurity region 7. The n-type impurity region 5 is shallower than the p-type impurity region 7 and has a depth of, for example, about 200 nm.

Next, as shown in FIG. 4(b), a part of the surface part of the p-well region 4 is doped with a p-type impurity at a high concentration by ion implantation using a mask 6 in order to provide a contact between the p-well region 4 and the ohmic electrode 13 to be formed later. Thus, the p-type impurity region 7 is formed. The thickness of the p-type impurity region 7 is about 200 nm, and the impurity concentration thereof is about $5 \times 10^{19}$ cm$^{-3}$ or lower. The ion implantation is performed in the same manner as for forming the p-well region 4.

Then, in order to activate the implanted impurity, the silicon carbide semiconductor substrate 1 is entirely subjected to activation annealing at 1700° C. for 30 minutes in an inert gas atmosphere of argon or the like. By this treatment, exposed surfaces of the silicon carbide semiconductor layer 2, the p-well region 4, the p-type impurity region 7 and the n-type impurity region 5 are caused to have macro steps or hillocks having heights of about 10 nm to 100 nm as a result of the high temperature thermal treatment. This increases the surface roughness and deteriorates the smoothness of the surface.

Next, as shown in FIG. 4(c), after the mask 6 is removed, the channel layer 8 is epitaxially grown on the silicon carbide semiconductor layer 2, the p-type well 4, the n-type impurity region 5 and the p-type impurity region 7 by, for example, thermal CVD. For forming the channel layer 8, for example, silane (SiH$_4$) and propane (C$_3$H$_8$) are used as a material gas, hydrogen (H$_2$) is used as a carrier gas, and nitrogen (N$_2$) is used as a dopant gas. Then, a part of the channel layer 8 which is located above the n-type impurity region 5 and the p-type impurity region 7 is removed from, for example, RIE to form a contact hole.

Next, exposed surfaces of the channel layer 8, the n-type impurity region 5 and the p-type impurity region 7 are thermally oxidized to form the gate insulating layer 9 of a silicon oxide layer. The gate insulating layer 9 is formed as follows, for example. The substrate is held in a quartz tube, and oxygen is introduced into the quartz tube at a flow rate of 2.5 (liters/min.). Thermal oxidation is performed for 2.5 hours while the temperature in the quartz tube is kept at 1180° C. As a result, the gate insulating layer 9 of a thermally oxidized layer having a thickness of about 70 nm is formed.

Next, a polysilicon layer having a thickness of 500 nm is deposited by reduced pressure CVD, and a part of the polysilicon layer which is located in and around the contact hole is removed by, for example, RIE or the like. As a result, the gate electrode 10 is formed on the gate insulating layer 9.

Next, as shown in FIG. 4(d), a first interlayer insulating layer 11 formed of silicon nitride (SiN) is grown to about 200 nm by reduced pressure CVD to cover the surface of the silicon carbide semiconductor layer 2 and the gate electrode 10. At this point, using the same mask as used for forming the p-type impurity region 7 shown in FIG. 4(b), an opening for exposing the p-type impurity region 7 is formed in the first interlayer insulating layer 11 by usual photolithography and RIE.

As shown in FIG. 4(e), a stacking layer 12 of a nickel layer and an aluminum layer is deposited on the first interlayer insulating layer 11 and the p-type impurity region 7 by vacuum vapor deposition or the like. The nickel layer and the aluminum layer preferably have a thickness of 50 nm or greater and 150 nm or smaller and a thickness of 10 nm or greater and 50 nm or smaller, respectively. In the stacking layer 12, either the nickel layer or the aluminum layer may be the lower layer. Note that since aluminum has a low melting point, in the case where the aluminum layer may cause a problem of being melted to flow out during the thermal treatment performed to form the ohmic contact described below, it is preferable to form the aluminum layer as the lower layer and the nickel layer having a high melting point as the upper layer, so that aluminum is prevented from flowing out.

Next, as shown in FIG. 4(f), thermal treatment is performed for 1 minute or longer in an inert gas of nitrogen, argon or the like. Owing to this thermal treatment, the nickel layer and the aluminum layer react with the p-type impurity region 7 in an area on the p-type impurity region 7 from which the interlayer insulating layer 11 has been removed. As a result, the p-type ohmic electrode 13 formed of an alloy of nickel, aluminum, silicon and carbon is provided. In this process, neither nickel nor aluminum is largely diffused to the p-type impurity region 7. The thermal treatment is preferably performed at a temperature of 850° C. or higher and 1050° C. or lower in order to promote the reaction with nickel and aluminum and in order to prevent denaturing or deformation of a material used for an interlayer such as SiN, SiO$_2$ or the like. At this point, the first interlayer insulating layer 11 and the stacking layer 12 do not substantially react with each other.

Next, as shown in FIG. 4(g), a part of the stacking layer 12 which is located on the first interlayer insulating layer 11 is selectively removed by dry etching or wet etching together with the first interlayer insulating layer 11. This removes an unnecessary part and forms the p-type ohmic electrode 13. The stacking layer 12 excluding the p-type ohmic electrode 13 is completely removed together with the first interlayer insulating layer 11 provided therebelow. Owing to this, during the thermal treatment performed later for forming the n-type ohmic electrode, aluminum is prevented from being diffused and thus the reliability of the gate insulating layer is suppressed from being reduced.

Next, as shown in FIG. 4(h), a silicon oxide layer having a thickness of about 1 μm is deposited as a second interlayer insulating layer 14 for covering the entire surface of the silicon carbide semiconductor substrate 1. A contact hole for exposing the p-type ohmic electrode 13 and an area of the n-type impurity region 5 which is to become the n-type ohmic electrode 16 is formed by RIE or the like.

Next, as shown in FIG. 4(i), a titanium layer 15 is deposited on the second interlayer insulating layer 14, on the p-type ohmic electrode 13 and on a part of the n-type impurity region 5 which is exposed as a result of the second interlayer insulating layer 14 being removed (on the ohmic electrode 13 and a part on which the ohmic electrode 16 is to be formed) by vacuum vapor deposition or the like.

Next, as shown in FIG. 4(j), the silicon carbide semiconductor substrate 1 is entirely subjected to thermal treatment for 1 minute or longer in an inert gas atmosphere of nitrogen, argon or the like. Owing to this thermal treatment, the titanium layer 15 is selectively reacted with silicon and carbon in the silicon carbide in the part of the n-type impurity region 5 from which the second interlayer insulating layer 14 has been removed. As a result, the n-type ohmic electrode 16 is formed of an alloy of titanium, silicon and carbon. The thermal treatment is preferably performed at a temperature of 850° C. or higher and 1050° C. or lower in order to cause alloy reaction of titanium, silicon and carbon in the silicon carbide and in order to prevent denaturing or deformation of a material used for an interlayer such as SiO$_2$ or the like. At this point, the second interlayer insulating layer 14 and the titanium layer 15 do not substantially react with each other.

By this thermal treatment, titanium on the p-type ohmic electrode 13 is slightly diffused to the p-type ohmic electrode 13. Therefore, the alloy of the p-type reaction layer forming the p-type ohmic electrode 13 contains an alloy of nickel, aluminum, titanium, silicon and carbon.

Regarding the thermal treatment, in the case where the silicon carbide semiconductor substrate 1 is heated in a nitrogen atmosphere, a part of the titanium layer 15 which does not form silicide becomes titanium nitride. Therefore, as shown in FIG. 4(k), titanium nitride is selectively removed using the reactivity difference between titanium nitride and the alloy of titanium, silicon and carbon. For example, titanium nitride is selectively removed by wet etching using a phosphoric acid-based etchant containing an aqueous solution of hydrogen peroxide. Owing to this, an unnecessary part of the titanium layer 15 is removed to form the n-type ohmic electrode 16. In this case, the titanium nitride layer on the p-type ohmic electrode 13 is also removed. In the case where the thermal treatment is performed in an argon atmosphere, a part of the titanium layer 15 which does not form alloy remains titanium. Therefore, the titanium layer 15 is removed using the reactivity difference between titanium and the alloy of titanium, silicon and carbon. Such a method does not require the titanium layer 15 to be patterned, which decreases the number of production steps of the semiconductor device and thus reduces the production cost and shortens the time necessary for the production.

Then, as shown in FIG. 4(l), an aluminum layer having a thickness of about 3 μm is deposited by vacuum vapor deposition or the like and patterned by usual photolithography and etching to form the pad electrode 17. Then, either one of Ti, Ni, Au, Ag, Pt or the like or a stacking layer of a plurality thereof is deposited by vacuum vapor deposition or the like to form a rear side electrode as the drain electrode 18.

In this manner, the double implantation MISFET is completed. The MISFET had a high channel mobility of 30 cm$^2$/Vsec or higher, an OFF withstand voltage of 1400 V and an ON resistance of 5 mΩ·cm$^2$ or lower.

The produced MISFET had the following characteristics.
Channel mobility: 30 cm$^2$/Vsec or higher (Vds=1 V)
OFF withstand voltage: 1400 V or higher
On resistance: 5 mΩ·cm$^2$ or lower
n-type contact resistance: $1 \times 10^{-5}$ Ω·cm$^2$ or lower
p-type contact resistance: $1 \times 10^{-3}$ Ω·cm$^2$ or lower
The measurement conditions are a gate voltage of 20 V and a drain voltage of 1 V.

In a semiconductor device produced by such a procedure, ohmic electrodes having different compositions can be formed to the n-type impurity region and the p-type impurity region even with a contact structure in which the n-type impurity region and the p-type impurity region are adjacent to each other.

This makes it possible to select an appropriate ohmic electrode material for each of the n-type impurity region and the p-type impurity region. Thus, a low resistance ohmic contact is realized even without increasing the impurity concentration of the n-type impurity region or the p-type impurity region. Therefore, in the MISFET, the contact resistance can be decreased by forming a low resistance p-type ohmic electrode without increasing the n-type contact resistance which significantly influences the ON resistance. As a result, the switching (turn-off) characteristics can be improved.

Embodiment 2

Figure 5:
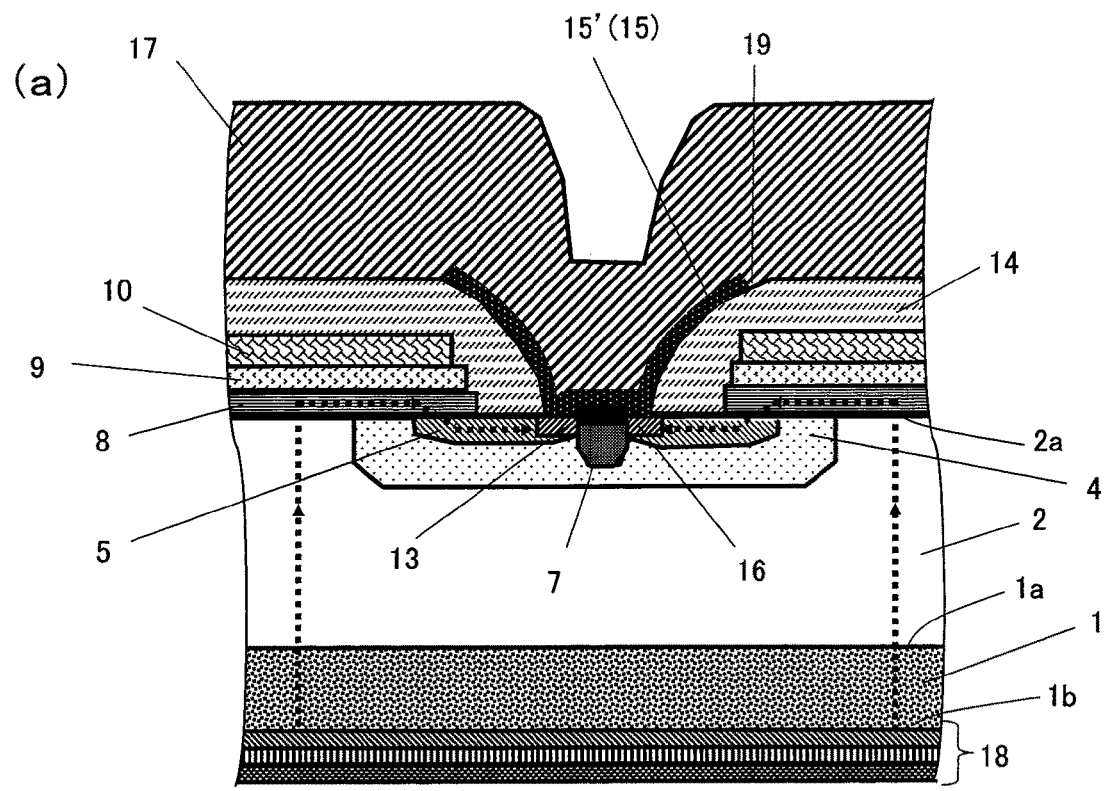
FIG. 5(a) is a cross-sectional view showing a structure of a semiconductor device in Embodiment 2 according to the present invention.
FIG. 5(b) shows an ohmic electrode and the vicinity thereof in enlargement.
Figure 5:
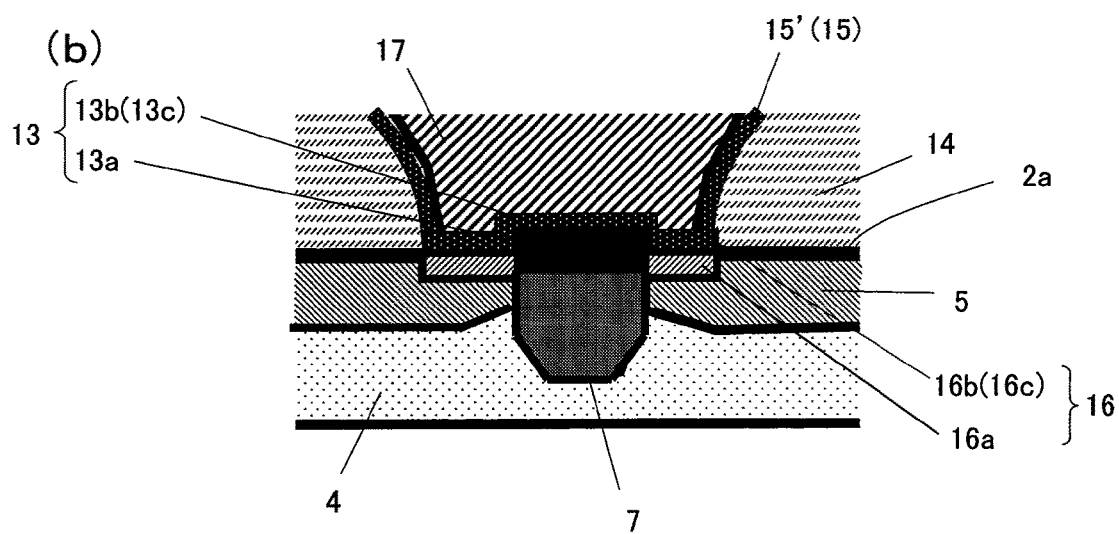

FIG. 5(a) is a schematic cross-sectional view showing a semiconductor device in Embodiment 2 according to the present invention. FIG. 5(b) is a cross-sectional view showing, in enlargement, a structure of an n-type ohmic electrode 16, a p-type ohmic electrode 13 and the vicinity thereof.

The semiconductor device in this embodiment is different from that in Embodiment 1 in the following points: (1) a nitrogenized titanium layer 15' is provided on a side surface of the contact hole of the second interlayer insulating layer 14; (2) the n-type ohmic electrode 16 includes an n-type reaction layer 16a containing an alloy of titanium, silicon and carbon and a titanium nitride layer 16b; and (3) the p-type ohmic electrode 13 includes a p-type reaction layer 13a containing an alloy of nickel, aluminum, titanium, silicon and carbon and a titanium nitride layer 13b.

The nitrogenized titanium layer 15', the titanium nitride layer 16b and the titanium nitride layer 13b are derived from the titanium layer for forming the n-type reaction layer 16a of the n-type ohmic electrode 16.

The above-described structure is obtained as follows. After the p-type reaction layer 13a of the p-type ohmic electrode 13 is formed, the second interlayer insulating layer 14 having the contact hole 19 is formed. The titanium layer 15 is formed on the side surface of, and in, the contact hole 19. Then, the obtained assembly is thermally heated.

In the n-type ohmic electrode 16, the n-type reaction layer 16a is a part provided as a result of titanium of the titanium layer 15 reacting with silicon and carbon of the n-type impurity region 5, and the titanium nitride layer 16b is a part provided as a result of titanium of the titanium layer 15 reacting with nitrogen.

In the p-type ohmic electrode 13, the p-type reaction layer 13a forms an ohmic contact with the p-type impurity region 7, and the titanium nitride layer 16b is formed as a result of the titanium layer 15 formed on the p-type reaction layer 13a being nitrogenized by the thermal treatment performed for forming the n-type ohmic electrode 16. During the thermal treatment, titanium is slightly diffused from the titanium layer 15 to the p-type reaction layer 13a. Therefore, the p-type reaction layer 13a contains titanium. Note that since the p-type reaction layer 13a having good characteristics is already formed before the thermal treatment is performed for forming the n-type ohmic electrode 16, there is substantially no influence caused by the diffusion of titanium.

The n-type reaction layer 16a and the p-type reaction layer 13a respectively contact the n-type impurity region 5 and the p-type impurity region 7 to realize good ohmic contacts. As described in Embodiment 1, it is preferable that the n-type reaction layer 16a and the p-type reaction layer 13a each have a thickness of 10 nm or greater.

According to this embodiment, as in Embodiment 1, even with a contact structure in which the n-type impurity region 5 and the p-type impurity region 7 are adjacent to each other, n-type and p-type ohmic electrodes having different metal compositions can be formed. Since the titanium nitride layers (13b, 16b) are formed on the side surface of the contact hole, diffusion of aluminum from the pad electrode 17 to the second interlayer insulating layer 14 can be suppressed.

In this embodiment, the nitrogenized titanium layer 15', the titanium nitride layer 16b and the titanium nitride layer 13b are formed by performing thermal treatment for forming the n-type reaction layer 16a. Alternatively, the thermal treatment may be performed with an inert gas which does not react with the titanium layer 15. In this case, the titanium layer 15 remains as it is on the side surface of the contact hole 19 even after the thermal treatment. Also in this case, the n-type ohmic electrode 16 includes the n-type reaction layer 16a containing an alloy of titanium, silicon and carbon and a titanium layer 16c, and the p-type ohmic electrode 13 includes the p-type reaction layer 13a containing an alloy of nickel, aluminum, titanium, silicon and carbon and a titanium layer 13c.

Hereinafter, an example of method for producing a semiconductor device shown in FIG. 5(a) will be described. FIGS. 6(a) through (l) are cross-sectional views during the production of the semiconductor device.

Figure 6:
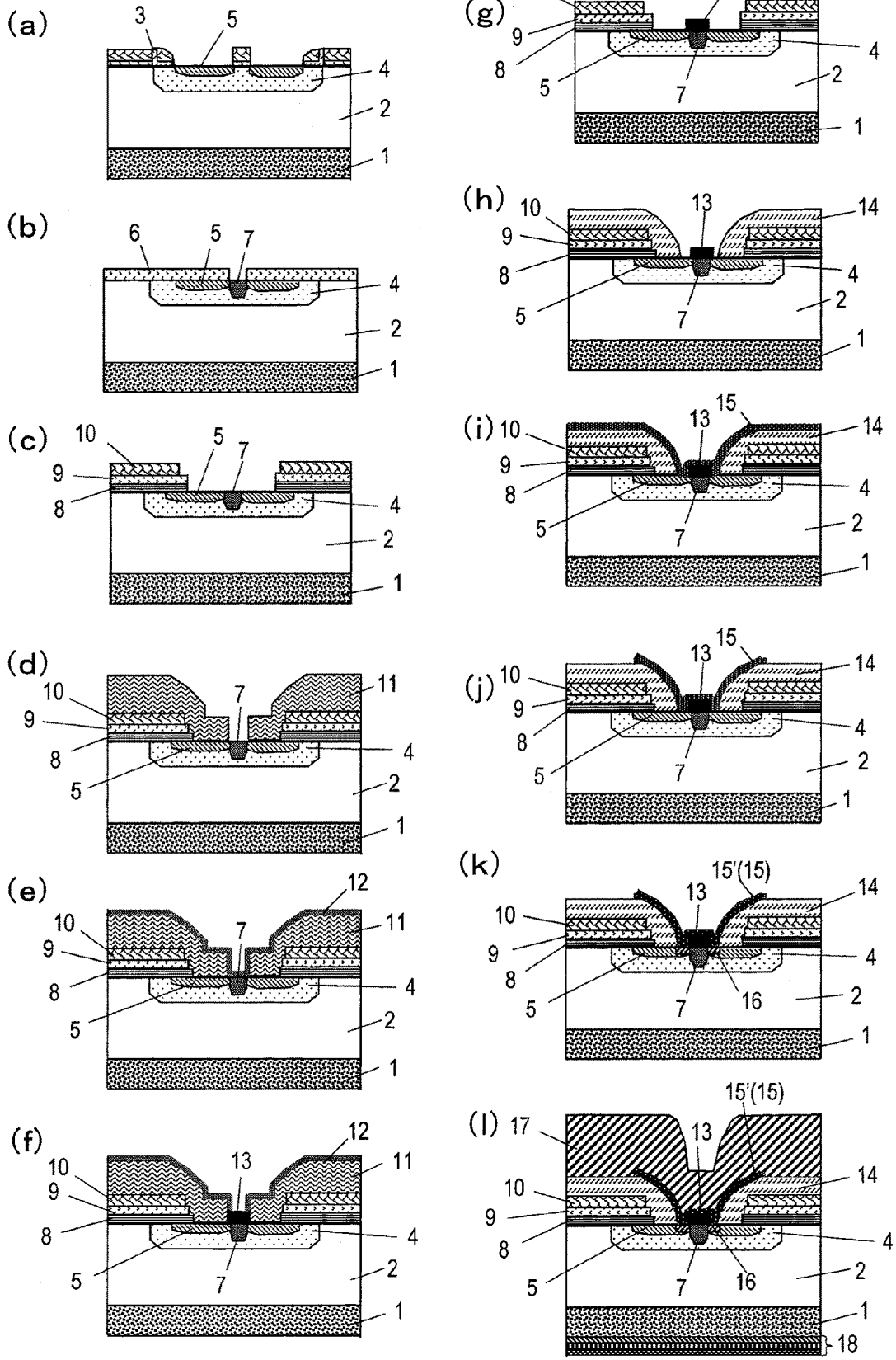
FIGS. 6(a) through (l) are cross-sectional views of steps showing a method for producing the semiconductor device shown in FIG. 5.

First, the steps shown in FIGS. 6(a) through (i) are performed in substantially the same manner described above with reference to FIGS. 4(a) through (i) in Embodiment 1 to obtain the structure shown in FIG. 6(i). As a result of performing these steps, the structure shown in FIG. 6(i) is obtained, in which the p-type ohmic electrode 13, the second interlayer insulating layer 14 having a contact hole for exposing a part of the n-type impurity region 5 which is to become the n-type ohmic electrode 16, and the titanium layer 15 provided on the second interlayer insulating layer 14 and in the contact hole are stacked.

Figure 7:
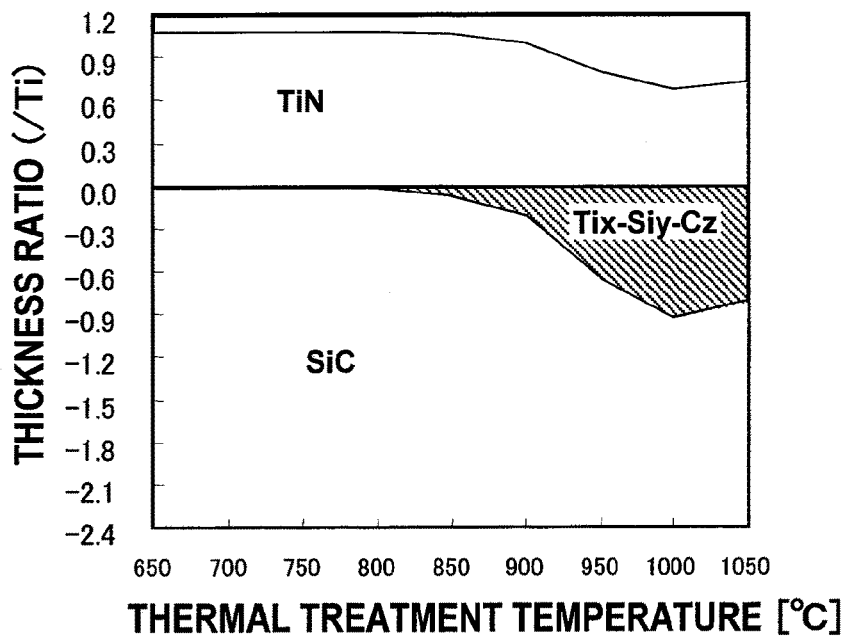
FIG. 7 shows the temperature dependency of the thickness of a titanium alloy layer generated by depositing titanium on a silicon carbide semiconductor substrate and thermally treating the resultant assembly at a high temperature.

Next, the titanium layer 15 and the n-type impurity region 5 are reacted with each other to form the n-type reaction layer and a titanium nitride layer. FIG. 7 is a graph showing the temperature dependency of the thickness of a titanium nitride layer and the thickness of a reaction layer of titanium, silicon and carbon, which are generated by depositing titanium on a silicon carbide semiconductor and performing thermal treatment in a nitrogen atmosphere. As shown in FIG. 7, at a low temperature, only titanium nitride is generated, and at 800° C. or higher, titanium starts reacting with silicon and carbon in the silicon carbide.

In the case where the thermal treatment is performed at a temperature of 850° C. or higher and 1050° C. or lower as described later, the following occurs. At 850° C., a majority of the titanium layer formed becomes a titanium nitride layer and almost no reaction layer is generated. Even in this case, the titanium layer 15 needs to have a thickness of about 150 nm in order to make the thickness of the reaction layer 10 nm or greater. By contrast, at 1050° C., about a half of the titanium layer formed becomes a reaction layer. In this case, it is preferable that the titanium layer has a thickness of about 200 nm in order to avoid the n-type impurity region 5 from becoming completely a reaction layer. The thickness of the titanium layer 15 is determined based on the thermal treatment temperature in consideration of these points.

Next, as shown in FIG. 6(j), the titanium layer 15 on the second interlayer insulating layer 14 is patterned. At this point, a part of the titanium layer 15 is removed by dry etching or wet etching by RIE, such that the titanium layer 15 is left in a larger area than the p-type ohmic electrode 13 and the n-type ohmic electrode 16. This is done in consideration of a shift which may occur when positional alignment to the mask is performed.

Next, as shown in FIG. 6(k), the silicon carbide semiconductor substrate 1 is entirely subjected to thermal treatment for 1 minute or longer in an inert gas of nitrogen, argon or the like. Owing to this thermal treatment, the titanium layer 15 and silicon in the n-type impurity region 5 are selectively reacted with each other in the n-type impurity region 5 to form the n-type ohmic electrode 16 containing an alloy of titanium, silicon and carbon. The thermal treatment is preferably performed at a temperature of 850° C. or higher and 1050° C. or lower in order to cause alloy reaction of titanium and silicon in the silicon carbide and in order to prevent denaturing or deformation of a material used for an interlayer such as $SiO_2$ or the like. More preferably, the temperature of the thermal treatment is 900° C. or higher and 950° C. or lower. Where the thermal treatment temperature is 900° C. or higher and 950° C. or lower, as shown in FIG. 7, the titanium nitride layer is thicker than the n-type reaction layer to be formed, which is a layer generated as a result of reaction of titanium, silicon and carbon.

In the case where nitrogen is used as the atmosphere gas for the thermal treatment, the titanium layer 15 on the p-type ohmic electrode 13 and the n-type ohmic electrode 16 becomes a nitrogenized titanium layer 15'. The titanium layer 15 on the p-type ohmic electrode 13 becomes titanium nitride and is slightly diffused to the p-type reaction layer of the p-type ohmic electrode 13 but does not react so as to exert any adverse influence on the ohmic characteristics of the p-type reaction layer. Therefore, the titanium layer 15 on the p-type ohmic electrode 13 does not need to be removed before the thermal treatment. Accordingly, it is not necessary to positionally align the titanium layer 15 and the p-type ohmic electrode 13 when patterning the titanium layer 15.

Then, like in Embodiment 1, as shown in FIG. 6(l), an aluminum layer having a thickness of about 3 μm is deposited by vacuum vapor deposition or the like and patterned by usual photolithography and etching to form the pad electrode 17. Then, either one of Ti, Ni, Au, Ag, Pt or the like or a stacking layer of a plurality thereof is deposited by vacuum vapor deposition or the like to form a rear side electrode as the drain electrode 18.

In this manner, the double implantation MISFET is completed.

The semiconductor device in this embodiment includes the channel layer provided by epitaxial growth. As understood from the above description, the present invention does not rely on the position or structure of the channel layer. Accordingly, the present invention can realize a semiconductor device in which any of various channel structures and the above-described ohmic electrodes are combined. For example, the present invention is preferably applicable to a MISFET using, as a channel layer, an inversion layer formed on a surface part of the silicon carbide semiconductor layer 2 in the p-well region 4 by a voltage applied to the gate electrode 10 instead of using the channel layer 8.

The semiconductor device in this embodiment includes a gate insulating layer provided by thermal oxidization. The layer does not need to be thermally oxidized, and may be a silicon oxide layer deposited by CVD or the like. Alternatively, the gate insulating layer may have a stacking structure of a thermally oxidized layer and a deposited layer. The gate insulating layer does not need to be a silicon oxide layer, and may be a metal oxide layer such as a silicon nitride layer, a silicon oxynitride layer, a tantalum oxide layer, a hafnium oxide layer or the like.

In the semiconductor device in this embodiment, the gate electrode is formed of polysilicon doped with an n-type impurity by reduced pressure CVD. It is not absolute necessary to use polysilicon, and a metal layer of aluminum, molybdenum or the like deposited by vapor deposition, sputtering or the like may be used.

Experiment Examples

In order to confirm the effects of the present invention, the electric characteristics of the p-type ohmic electrode 13 were measured and the composition thereof was analyzed. The results are shown below.

1. Electric Characteristics of the P-Type Ohmic Electrode 13

Figure 8:
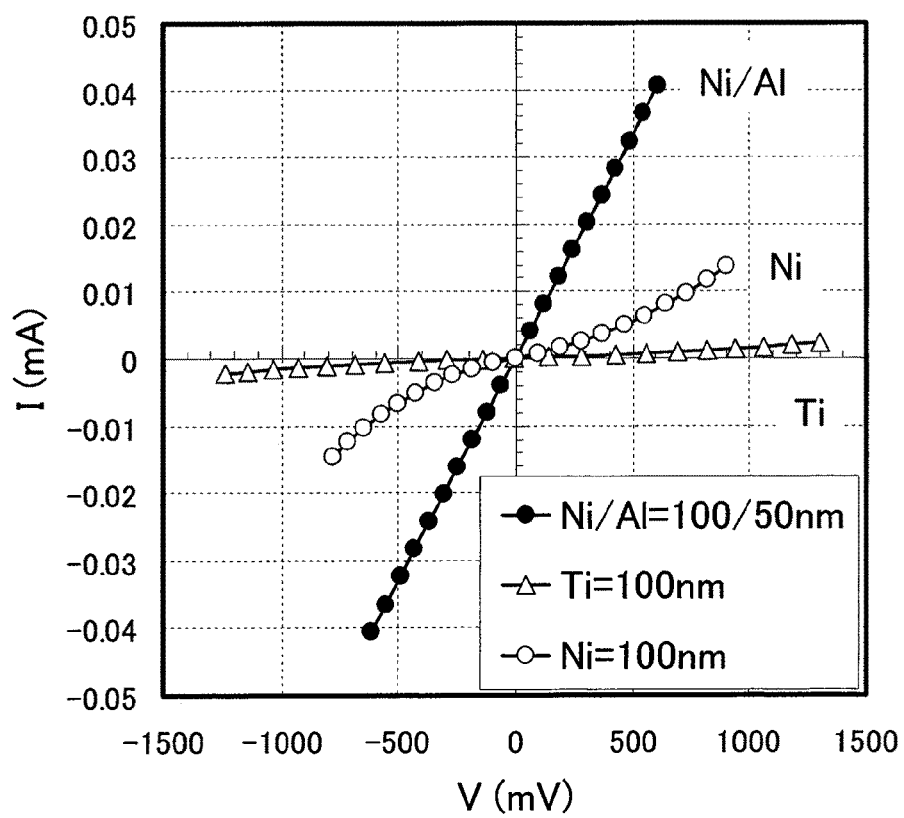
FIG. 8 shows the current vs. voltage characteristic of a silicon carbide/metal layer interface formed by vapor-depositing each of a nickel/aluminum stacking layer, a nickel layer and a titanium layer on a p-type silicon carbide semiconductor substrate having an impurity concentration of $5\times10^{19}$ $cm^{-3}$ and thermally treating the resultant assembly.

FIG. 8 shows the current vs. voltage characteristic of a p-type contact formed as follows as in Embodiment 1. On a p-type silicon carbide semiconductor substrate having an impurity concentration of $5 \times 10^{19}$ cm$^{-3}$, a nickel/aluminum stacking layer, a nickel layer, and a titanium layer were each vapor-deposited and thermally treated at 950° C. for 2 minutes. As shown in FIG. 8, the ohmic characteristic provided by a nickel/aluminum layer shows a significant improvement in the current vs. voltage characteristic over the case where a silicide layer of a single nickel layer or a silicide layer of a single titanium layer is formed, and an ohmic characteristic is realized even at a low concentration of nickel/aluminum. From this, it is understood that use of nickel/aluminum for a p-type ohmic electrode realizes a low resistance ohmic contact.

2. Composition Analysis of the P-Type Ohmic Electrode 13

On the silicon carbide semiconductor substrate, a nickel layer of 100 nm and an aluminum layer of 50 nm were deposited, and the resultant sample was thermally treated at 950° C. for 1 minute in a nitrogen atmosphere. This sample is labeled as sample A.

After the thermal treatment, titanium of 100 nm was deposited, and the resultant sample was thermally treated at 950° C. for 1 minute in a nitrogen atmosphere. This sample is labeled as sample B. Then, the titanium nitride layer was removed using a phosphoric acid-based etchant. The resultant is labeled as C.

Figure 9:
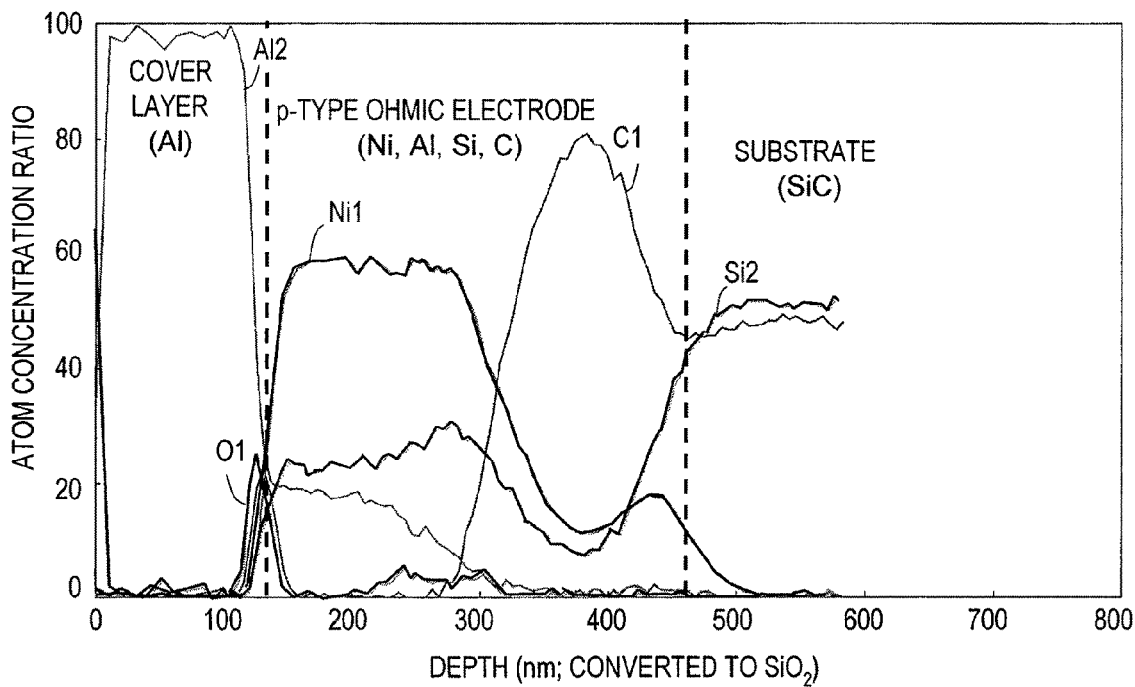
FIG. 9 shows AES analysis results of a p-type ohmic electrode formed on a silicon carbide semiconductor substrate.
Figure 10:
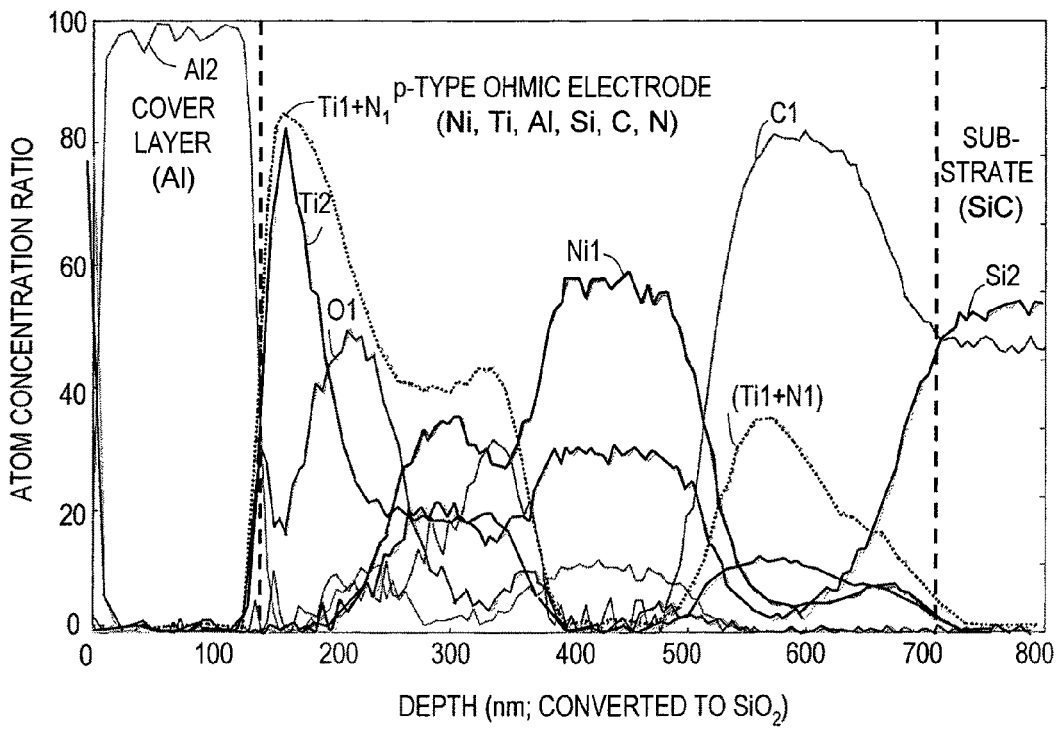
FIG. 10 shows AES analysis results of another p-type ohmic electrode formed on a silicon carbide semiconductor substrate.
Figure 11:
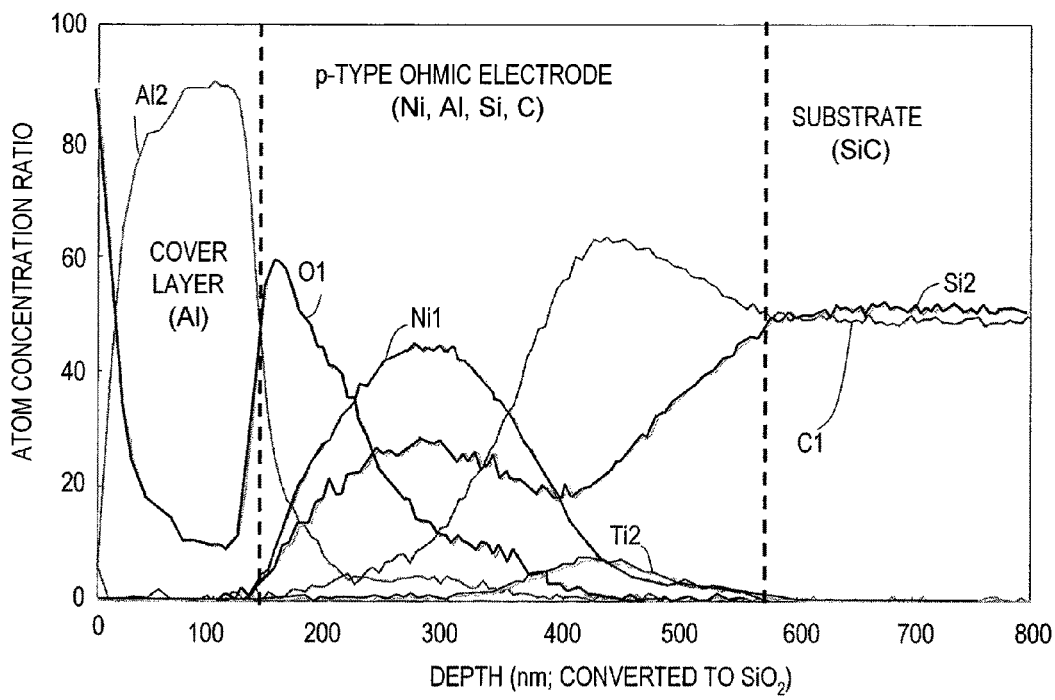
FIG. 11 shows AES analysis results of still another p-type ohmic electrode formed on a silicon carbide semiconductor substrate.

On each of samples A, B and C, an aluminum layer of 150 nm was deposited, and the compositions of the resultant samples A, B and C in the depth direction were analyzed by Auger electron spectroscopy (AES). FIGS. 9, 10 and 11 show the analysis results. In these figures, Al2, Ni1, C1, Si2, Ti1+N1 and Ti1 respectively show the distributions of aluminum, nickel, carbon, silicon, titanium bonded to nitrogen, and titanium.

Sample A corresponds to a p-type ohmic electrode, which, after being formed, is not provided thereon with titanium for forming an n-type ohmic electrode. Samples B and C respectively correspond to the ohmic electrode 13 in Embodiment 2 and the ohmic electrode 13 in Embodiment 1.

It is understood from FIGS. 9 through 11 that an alloy containing nickel, aluminum, silicon and carbon is formed in each p-type ohmic electrode. The carbon concentration of the p-type ohmic electrode is higher on the silicon carbide substrate side than on the surface side thereof, i.e., on the side of the cover layer formed of aluminum.

In sample B, peaks of titanium bonded to nitrogen and titanium are shown on the surface side of the p-type ohmic electrode. It is understood that a titanium nitrogen layer is generated on the surface side of the p-type ohmic electrode and that a p-type reaction layer of an alloy containing nickel, aluminum, silicon and carbon is generated on the silicon carbide substrate side. The p-type reaction layer also contains titanium.

From sample C, the titanium nitride layer generated is removed. Therefore, there is no distribution area of the element corresponding to the titanium nitride layer of sample B. However, it is understood that the p-type reaction layer of an alloy containing nickel, aluminum, silicon and carbon also contains titanium.

It is also understood that in sample A, carbon exists at an interface between the aluminum cover layer and the p-type ohmic electrode. This is considered to occur because carbon in the silicon carbide substrate is diffused to the p-type ohmic electrode and also deposited in the vicinity of the surface.

By contrast, in sample B, almost no carbon exists at an interface of the aluminum cover layer and the p-type ohmic electrode. A conceivable reason for this is that titanium and carbon are bonded together in the vicinity of the border between the titanium nitride layer 13b and the p-type reaction layer 13a in the p-type ohmic electrode and thus the diffusion of carbon to the interface of the aluminum cover layer and the p-type ohmic electrode is suppressed. In sample C, carbon existing at the border between the titanium nitride layer and the p-type reaction layer is considered to be removed when the titanium nitride layer is removed.

In samples B and C, no titanium existed when the p-type ohmic electrode was formed, and so titanium is not an important element in the p-type ohmic electrode. Therefore, the p-type ohmic electrode is maintained at a low resistance with almost no titanium.

From these results, it is understood that even if, after the p-type ohmic electrode is formed, a titanium layer for the n-type ohmic electrode is formed on the p-type ohmic electrode and thermally treated, the composition of the p-type ohmic electrode is not significantly influenced. It is also understood that the titanium layer can suppress carbon from being deposited on the surface of the p-type ohmic electrode.

INDUSTRIAL APPLICABILITY

A semiconductor device and a method for producing the same according to the present invention are preferably usable for a silicon carbide semiconductor device, and especially preferably usable for a silicon carbide semiconductor device for a power device.

The invention claimed is:

1. A method for producing a semiconductor device, comprising:
   a step (a) of preparing a silicon carbide semiconductor layer including an n-type impurity region and a p-type impurity region provided so as to be adjacent to each other;
   a step (b) of forming a stacking layer including a nickel layer and an aluminum layer on the p-type impurity region;
   a step (c) of thermally treating the stacking layer to form a p-type ohmic electrode containing an alloy of nickel, aluminum, silicon and carbon on the p-type impurity region;
   a step (d) of forming a titanium layer on at least a part of the n-type impurity region; and
   a step (e) of thermally treating the titanium layer to form an n-type ohmic electrode containing an alloy of titanium, silicon and carbon on the n-type impurity region,
   wherein the thermal treatment in steps (c) and (e) is performed at a temperature of 850° C. or higher and 1050° C. or lower,
   wherein the thermal treatment in steps (c) and (e) is performed in an atmosphere containing nitrogen gas or argon gas,
   wherein the step (b) includes:
   a step (b1) of forming a mask for exposing the p-type impurity region on the silicon carbide semiconductor layer; and
   a step (b2) of forming the stacking layer on the p-type impurity region and the mask;
   wherein the method comprises a step (f) of removing the stacking layer on the mask between the step (b2) and the step (d).

2. The method for producing the semiconductor device of claim 1, wherein the step (d) includes:
   a step (d1) of forming an insulating layer having a contact hole for exposing a part of the n-type impurity region and the p-type ohmic electrode on the silicon carbide semiconductor layer; and
   a step (d2) of forming the titanium layer on the part of the n-type impurity region in the contact hole, on the p-type ohmic electrode and on the insulating layer;
   wherein the method comprises a step (g) of removing at least a part of the titanium layer on the insulating layer after the step (d2).

3. The method for producing the semiconductor device of claim 2, wherein in the step (g), the titanium layer is removed by wet etching.

4. The method for producing the semiconductor device of claim 2, wherein in the step (g), the titanium layer is removed by dry etching.

5. The method for producing the semiconductor device of claim 1, wherein in the step (f), the stacking layer is removed by wet etching.

6. The method for producing the semiconductor device of claim 1, wherein in the step (f), the stacking layer is removed by dry etching.

7. The method for producing the semiconductor device of claim 1, wherein in the step (f), the mask is removed to remove the stacking layer on the mask.

8. The method for producing the semiconductor device of claim 1, wherein in the step (a), the mask forms the p-type impurity region in the silicon carbide semiconductor layer by implantation of impurity ions.

9. The method for producing the semiconductor device of claim 1, wherein the step (e) includes:
   a step (e1) of thermally treating the titanium layer to react silicon and carbon in the n-type impurity region with a part of the titanium layer to form an alloy of titanium, silicon and carbon; and
   a step (e2) of removing an unreacted part of the titanium layer to form an n-type ohmic electrode containing the alloy on the n-type impurity region.

10. The method for producing the semiconductor device of claim 9, wherein in the step (e2), the part of the titanium layer not reacted with silicon or carbon is removed by wet etching.

* * * * *